United States Patent
Baek et al.

(10) Patent No.: US 6,774,048 B2
(45) Date of Patent: Aug. 10, 2004

(54) METHOD OF MANUFACTURING A SEMICONDUCTOR DEVICE

(75) Inventors: Eun-Kyung Baek, Gyeonggi-do (KR); Sun-Hoo Park, Gyeonggi-do (KR); Hong-Gun Kim, Gyeonggi-do (KR); Kyung-Joong Yoon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 20 days.

(21) Appl. No.: 10/346,792

(22) Filed: Jan. 17, 2003

(65) Prior Publication Data

US 2003/0224617 A1 Dec. 4, 2003

(30) Foreign Application Priority Data

Jun. 4, 2002 (KR) .......................................... 2002-31421

(51) Int. Cl.[7] .............................................. H01L 21/31
(52) U.S. Cl. ........................ 438/758; 430/314; 430/316
(58) Field of Search .......................... 438/758; 430/314, 430/316

(56) References Cited

U.S. PATENT DOCUMENTS

| | | | | |
|---|---|---|---|---|
| 5,705,430 A | * | 1/1998 | Avanzino et al. | ........... 438/618 |
| 6,140,024 A | * | 10/2000 | Misium et al. | ............. 430/314 |
| 6,331,492 B2 | * | 12/2001 | Misium et al. | ............. 438/762 |
| 6,342,421 B1 | * | 1/2002 | Mitani et al. | ............... 438/300 |
| 6,362,085 B1 | * | 3/2002 | Yu et al. | ...................... 438/585 |
| 6,444,592 B1 | * | 9/2002 | Ballantine et al. | .......... 438/770 |
| 6,500,529 B1 | * | 12/2002 | McCarthy et al. | .......... 428/209 |
| 6,537,833 B1 | * | 3/2003 | Lensing | ........................ 438/14 |
| 6,548,312 B1 | * | 4/2003 | Hayano et al. | ................ 438/5 |
| 6,590,229 B1 | * | 7/2003 | Yamazaki et al. | ............ 257/71 |
| 6,630,361 B1 | * | 10/2003 | Singh et al. | .................... 438/7 |
| 6,673,638 B1 | * | 1/2004 | Bendik et al. | ................ 438/14 |

FOREIGN PATENT DOCUMENTS

JP          9-162291 A        6/1997

* cited by examiner

*Primary Examiner*—John F. Niebling
*Assistant Examiner*—Olivia T. Luk
(74) *Attorney, Agent, or Firm*—Myers Bigel Sibley & Sajovec

(57) ABSTRACT

A method of manufacturing a semiconductor device includes forming a silicon nitride layer on a semiconductor substrate on which a predetermined pattern is formed. The silicon nitride layer includes a plurality of bonds formed between silicon and nitrogen. A portion of the bonds formed between silicon and nitrogen is broken to form at least one free bonding site on a surface of the silicon nitride layer. A silane compound and a flow fill method are used to form a silicon oxide layer on the silicon nitride layer.

19 Claims, 13 Drawing Sheets

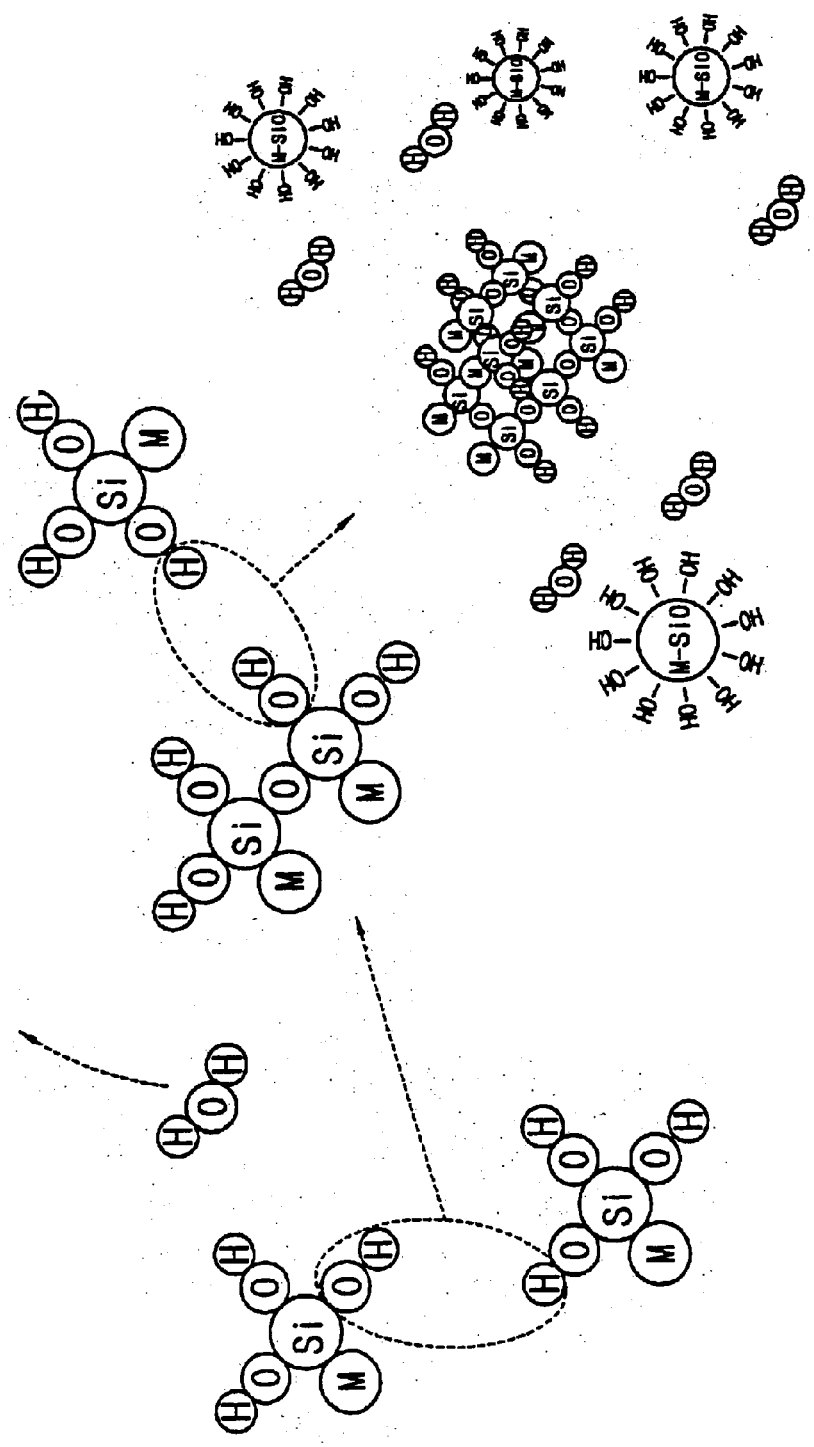

# METHOD OF MANUFACTURING A SEMICONDUCTOR DEVICE

RELATED APPLICATIONS

The present application claims priority from Korean Patent Application No. 2002-31421, filed Jun. 4, 2002, the disclosure of which is hereby incorporated herein by reference in its entirety.

FIELD OF THE INVENTION

The present invention relates to methods for manufacturing semiconductor devices and, more particularly, to a method for manufacturing a semiconductor device having an improved quality by increasing an adhesion and improving an interface characteristic between a silicon nitride layer and an oxide layer formed thereon.

BACKGROUND OF THE INVENTION

Recently, the design of semiconductor devices has experienced rapid progress as information media and devices such as computers are widely used. This progress has required semiconductor devices that can function at high operating speeds and to have large storage capacities. In order to satisfy such requirements, semiconductor devices with increased density, reliability, and response time speed are under development. To increase the degree of integration, the cell size should be reduced and, with the reduction in the cell size, the size and margin of all kinds of patterns formed on a semiconductor substrate also should be reduced. On the other hand, the aspect ratio of each component in the semiconductor device gradually increases.

A polysilicon gate structure having a good electric characteristic, reliability and degree of integration was adopted as a driving device from the initial VLSI. Therefore, the polysilicon gate structure has been largely developed in industrial fields such as LSI's for micro-computers or devices with high-density memories, and is now widely used in various fields. Because the melting point of polysilicon is high, a self-align method can be applied during the formation of a gate electrode along with a diffusion region of source and drain when using polysilicon. In addition, after patterning the gate electrode using polysilicon, a thermal oxidation of polysilicon may also be performed. Accordingly, damage generated at the edge portion of the gate electrode due to reactive ion etching may be compensated for. When an electric voltage is applied to the gate electrode, a high fringe electric field at the edge portion of the gate electrode is lowered to increase the reliability of the semiconductor device.

Meanwhile, the design rule of recently developed and highly integrated semiconductor devices has been reduced to about 0.15 μm or less. Accordingly, a self-align method is widely used in order to ensure a BC processing margin. A method of forming a contact hole of a semiconductor device by the self-align method will be described in detail below with reference to the attached drawings.

FIGS. 1A–1E are cross-sectional views illustrating a method of forming a contact hole of a semiconductor device in accordance with a conventional method.

Referring to FIG. 1A, a gate oxide layer 21 is formed on a semiconductor substrate 11 such as a silicon substrate. Then, a conductive layer and a capping insulation layer are subsequently formed on the gate oxide layer 21. The conductive layer is a doped polysilicon layer or a polycide layer. The polycide layer includes a doped polysilicon layer and a refractory metal silicide layer. As the refractory metal silicide layer, a tungsten silicide layer, a titanium silicide layer, a cobalt silicide layer, etc., are widely applied.

The capping insulation layer is preferably comprised of silicon nitride. A silicon nitride layer has a high etching selectivity with respect to an oxide layer. Then, the capping insulation layer and the conductive layer are continuously patterned to form parallel gate patterns 37 with a predetermined spacing on a predetermined region of the gate oxide layer 21. Each of the gate patterns 37 includes an integrated conductive layer pattern 31 and a capping insulation layer pattern 32. The conductive layer pattern 31 functions as a gate electrode.

Referring to FIG. 1B, a silicon nitride layer is formed on the entire surface of the substrate on which the gate patterns 37 are formed. Then, the silicon nitride layer is etched anisotropically to form a spacer 33 at the sidewall portions of the gate patterns 37. At this time, the gate oxide layer 21 formed between the gate patterns 37 may be over-etched to expose the semiconductor substrate 11 or such that a thinner oxide layer than the initial gate oxide layer 21 remains. When completing the formation of the spacer 33, the conductive pattern 21, i.e., the gate pattern, is completely surrounded by a gate oxide layer pattern 22, the capping insulation layer pattern 32 and the spacer 33.

During implementation of the anisotropic etching for forming the spacer 33, the surface portion of the semiconductor device is damaged. Therefore, after completing the anisotropic etching to form the spacer 33, a thermal oxidation is performed to remove the etching damage. Then, a thin thermal oxide layer is grown on the surface of the semiconductor substrate 11 between the gate patterns 37. Using the thin thermal oxide layer as a screen oxide layer, ion implantation is conducted to form a source/drain region (not shown) at the surface portion of the semiconductor substrate 11 between the gate patterns 37.

Referring to FIG. 1C, an etching stop layer 34 such as a silicon nitride layer is formed using a chemical vapor deposition (CVD) method. The preferred thickness of the etching stop layer 34 is in a range of from about 70 to about 150 Å. In FIG. 1C, the reference symbol G1 represents a gap size.

Referring to FIG. 1D, an interlayer dielectric 41 is formed on the etching stop layer 34 using an insulating material having a good filling characteristic into a concave portion. Conventionally, a high density plasma CVD oxide layer is formed, or a high density plasma CVD oxide layer and a low pressure CVD oxide layer are subsequently integrated to form the interlayer dielectric.

When the plasma CVD method is applied, the interlayer dielectric adheres to an underlying layer with sufficient adhesive power to prevent separation of the thus formed layer at the interface because the reactivity of the plasma is good. However, as the gap size formed by the etching stop layer becomes narrow, a void is formed. Accordingly, a flow fill method has been used recently instead of the plasma CVD method when the gap size formed between patterns is small.

The method of forming an interlayer dielectric using the flow fill method will be described in detail below. According to this method, a layer is formed by reacting silane with hydrogen peroxide gas utilizing, for example, an apparatus named Flow Fill and manufactured by Trikon Co. Ltd. This method is particularly appropriate for filling a small gap formed between patterns of an underlying layer. Silane compounds such as $SiH_4$, $CH_3SiH_3$, etc., are reacted with hydrogen peroxide ($H_2O_2$) to produce $SiO_2$ or $(SiOCH)n$ to form a silicon oxide layer. First, the silane compound and hydrogen peroxide are reacted with each other in gaseous phase to produce a hydroxy silane compound such as $Si(OH)_4$ or $CH_3Si(OH)_3$. This product generates a liquid phase reaction at the surface portion of the underlying layer to form a polymer though dehydration to deposit an oxide layer of $SiO_2$. Accordingly, when using the flow fill method on a layer having a small pattern gap, the generation of the aforementioned void can be avoided, and so this method is now in wide use.

Next, the interlayer dielectric 41 is planarized. A photoresist pattern 51 having a predetermined shape is formed for patterning the planarized interlayer dielectric.

Referring to FIG. 1E, an interlayer dielectric pattern 42 is formed and the etching stop layer 34 between the gate patterns 37 is exposed by etching the interlayer dielectric 41 using the photoresist pattern 51. Thereafter, the exposed etching stop layer 34 is etched to expose the semiconductor substrate 11 between the gate patterns 37 to form a self-aligned contact hole.

According to the above-described conventional flow fill method, the hydrophilic monomers $Si(OH)_4$, $CH_3Si(OH)_3$, etc., flow into the gap and achieve a good adhesion with the underlying silicon nitride layer during the deposition of the starting material to form the interlayer dielectric. Reaction at the interface during the flow fill method will be described in detail with reference to FIGS. 2A and 2B. As the starting material, $CH_3Si(OH)_3$ and $H_2O_2$ may be used. The symbol M in the drawings represents $CH_3$.

Referring to FIG. 2A, the surface reaction on the substrate is illustrated through a reaction between methyl silane and hydrogen peroxide. As the reaction of methyl silane and hydrogen peroxide proceeds, the hydrogen bonds in the methyl silane are replaced one by one with hydroxy bonds.

Referring to FIG. 2B, one molecule of water is removed from one pair of neighboring $CH_3Si(OH)_3$ compounds to make a bond through the medium of an oxygen atom between them. This reaction progresses continuously to accomplish the polymerization and to form a silicon oxide layer. When methyl silane is used as the starting material, an oxide layer including a basic unit of $(SiOCH)n$ (n represents a positive integer) is formed.

Because the substrate is formed of SiN and has a low hydrophilicity, the hydrophilic monomer formed during the deposition by the flow fill method, that is, $CH_3Si(OH)_3$, does not sufficiently flow into the small gap and does not sufficiently adhere with the underlying layer. As a result, this hydrophilic monomer comes off at the interface with the underlying layer during an annealing process that is implemented after completing the deposition. In order to address the above-described problem, a plasma treatment using $N_2O$, $O_2$, etc., is performed after forming the SiN layer.

FIGS. 3A and 3B are cross-sectional views for comparing the adhesion characteristics at the interface when the $N_2O$ plasma treatment is implemented or not, after forming the SiN layer. The construction of FIG. 3A is obtained when the plasma treatment is not implemented after forming the SiN layer and the construction of FIG. 3B is obtained when the $N_2O$ plasma treatment is implemented after forming the SiN layer. In the drawings, the portion designated by hatched lines at the interface of a nitride layer and an oxide layer indicates a portion that has come off at the interface.

When comparing the two drawings, it may be noted that the adhesion characteristic at the interface of the nitride layer and the oxide layer is better when the plasma treatment is implemented than when the plasma treatment is not implemented. It is believed that this improvement at the interface by the plasma treatment is obtained because a thin oxide layer is formed on the surface of the SiN layer by the plasma treatment and, as the result, the adhesion of the SiN layer with the material produced during the flow fill method is improved.

However, after completing the plasma treatment, small clefts at the interface are still found as a defect. Because the plasma has an anisotropy, the side portion of the gap between the patterns is not sufficiently treated to prevent the generation of some defects, especially when the gap is small.

Japanese Patent Laid-Open Publication No. Hei 9-162291 discloses a method of preventing the generation of a defect at an interface of a nitride layer and an interlayer dielectric. An insulating layer is formed by a plasma CVD method. The thus formed insulating layer is exposed to an ArF excimer laser and an ammonia gas is introduced to form nitride on the surface of the insulating layer. Then, an SOG insulating layer is formed on the layer on which the nitride is formed.

According to this method, an etching stop layer having a uniform thickness can be formed on the thus obtained layer on which the nitride layer is formed. When a high density plasma CVD oxide layer is formed on the etching stop layer, the etching stop layer can be prevented from coming off. However, this method is somewhat complicated and is difficult to perform when an oxide layer is formed as an insulating layer by the flow fill method.

SUMMARY OF THE INVENTION

According to method embodiments of the present invention, a method of manufacturing a semiconductor device includes forming a silicon nitride layer on a semiconductor substrate on which a predetermined pattern is formed. The silicon nitride layer includes a plurality of bonds formed between silicon and nitrogen. A portion of the bonds formed between silicon and nitrogen is broken to form at least one free bonding site on a surface of the silicon nitride layer. A silane compound and a flow fill method are used to form a silicon oxide layer on the silicon nitride layer.

According to further method embodiments of the present invention, a method of manufacturing a semiconductor device includes forming a silicon nitride layer on a semiconductor substrate on which a predetermined pattern is formed. The hydrophilicity of a surface of the silicon nitride layer is increased. A silane compound and a flow fill method are used to form a silicon oxide layer on the silicon nitride layer.

According to further method embodiments of the present invention, a method of manufacturing a semiconductor device includes forming a gate pattern on a semiconductor substrate. A spacer is formed on a side wall portion of the gate pattern. A silicon nitride layer is formed, the silicon nitride layer including a plurality of bonds formed between silicon and nitrogen. A portion of the bonds between silicon and nitrogen is broken to form free bonding sites on a surface of the silicon nitride layer. A silane compound and a flow fill method are used to form a silicon oxide layer on the silicon nitride layer.

Objects of the present invention will be appreciated by those of ordinary skill in the art from a reading of the figures and the detailed description of the preferred embodiments which follow, such description being merely illustrative of the present invention.

BRIEF DESCRIPTION OF THE DRAWINGS

The above and other objects and advantages of the present invention will become readily apparent by reference to the following detailed description when considered in conjunction with the accompanying drawings wherein:

FIGS. 2A and 2B illustrate chemical reaction mechanisms during formation of an oxide layer using a flow fill method;

FIGS. 3A and 3B are cross-sectional views for comparing adhesion characteristics at an interface after forming an oxide layer on an SiN layer and then implementing a heat treatment by a conventional flow fill method, wherein FIG. 3A shows a sectional view obtained without implementing any treatment while FIG. 3B shows a sectional view obtained when implementing an $N_2O$ plasma treatment after forming the SiN layer;

FIGS. 5A to 5D are graphs obtained by an XPS analysis on the surface of an SiN layer, wherein FIG. 5A represents the results obtained by analyzing the surface of the SiN layer onto which no treatment is implemented, FIG. 5B represents the results obtained by analyzing the surface of the SiN layer after implementing an $N_2O$ plasma, FIG. 5C represents the results obtained by analyzing the surface of the SiN layer after implementing a CDE treatment according to a first embodiment of the present invention, and FIG. 5D represents the results obtained by analyzing the surface of the SiN layer after implementing an NOR treatment according to a second embodiment of the present invention;

DETAILED DESCRIPTION OF THE PREFERRED EMBODIMENTS

Figure 1A:
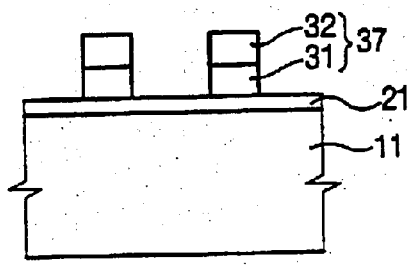
FIGS. 1A to 1E are cross-sectional views illustrating a method of forming a contact hole of a semiconductor device according to a prior art method.
Figure 1B:
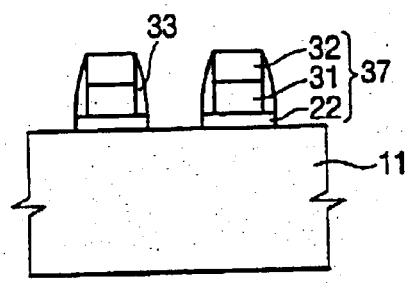
Figure 1C:
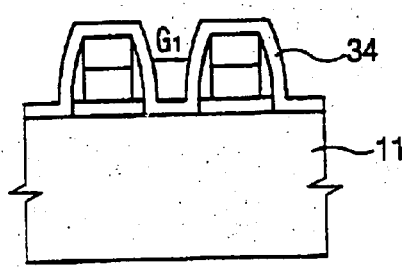
Figure 1D:
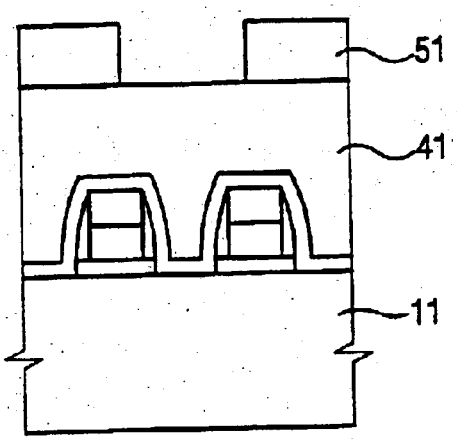
Figure 1E:
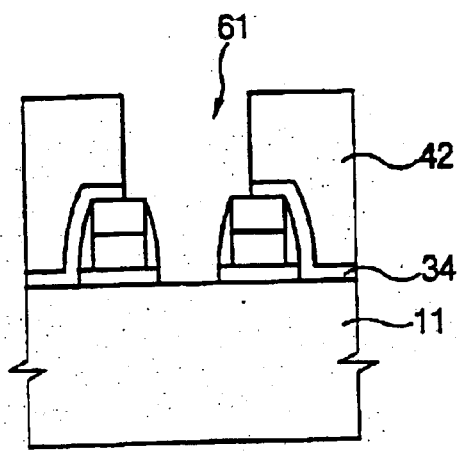
Figure 2A:
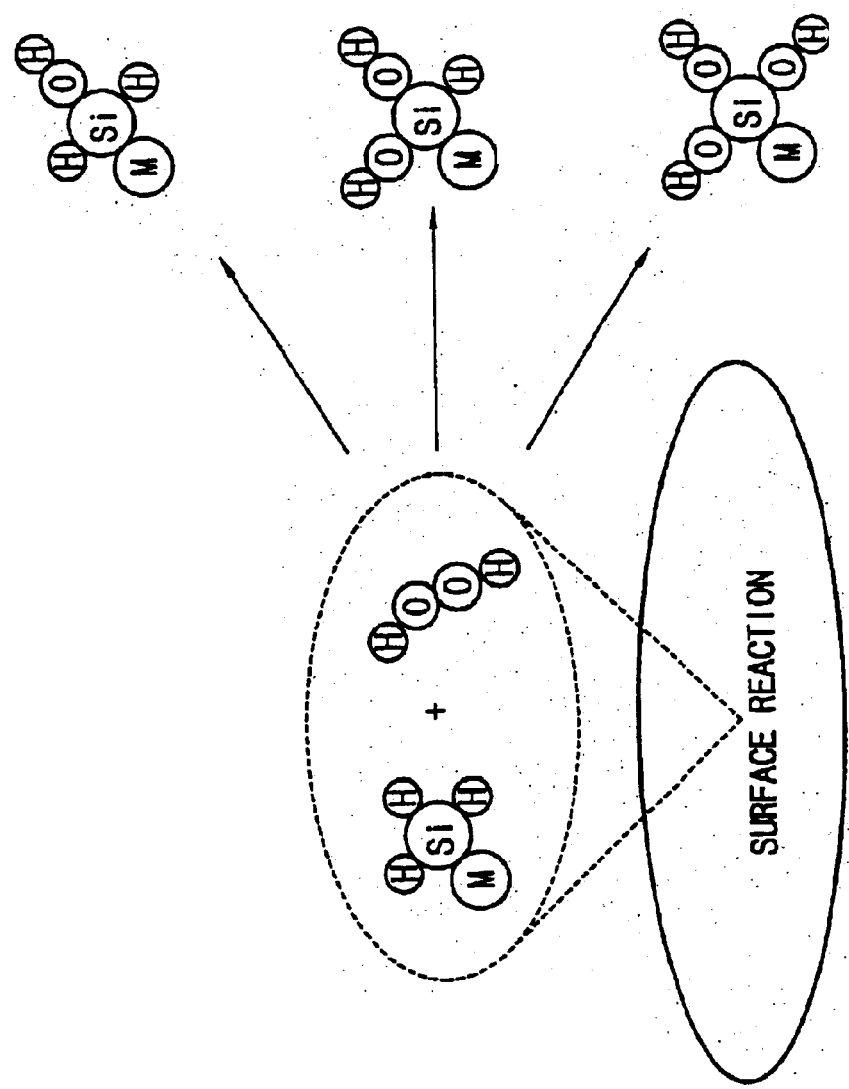
Figure 3A:
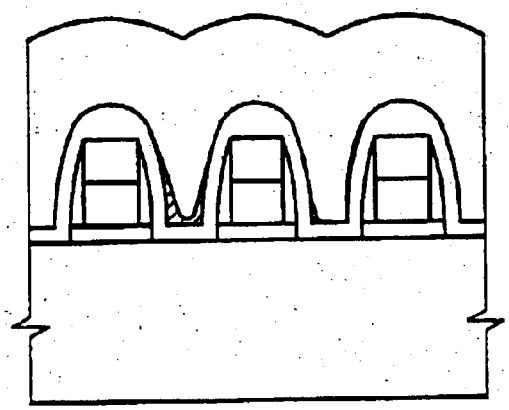
Figure 3B:
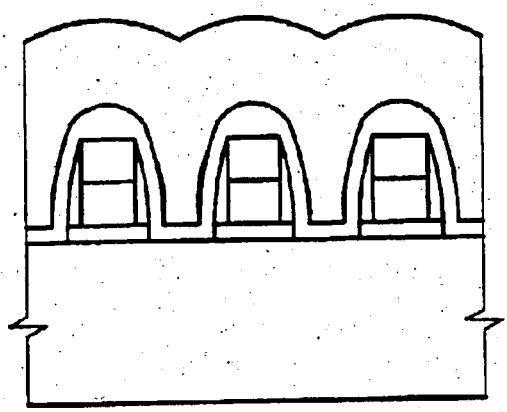

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present.

The present invention provides a method of manufacturing a semiconductor device having an improved quality using a novel method of forming an oxide layer on a silicon nitride layer by a flow fill method, and by preventing the generation of defects at an interface of the oxide layer and the silicon nitride layer.

To accomplish the foregoing, methods of the present invention for manufacturing a semiconductor device may comprise the following steps.

First, a silicon nitride layer is formed on a semiconductor substrate on which a predetermined pattern is formed. Then, a free bonding site or "dangling bond" is formed on a surface of the silicon nitride layer by breaking a portion of bonds formed between silicon and nitrogen. Thereafter, a silicon oxide layer is formed using a silane compound and a flow fill method.

In order to form the free bonding site, isotropic etching of the surface portion of the silicon nitride to about 10 to 20 Å is preferably carried out using a remote plasma. Preferably, the remote plasma is produced using a mixed gas including carbon tetrafluoride ($CF_4$), oxygen, nitrogen and hydrogen fluoride or a mixed gas including hydrogen, nitrogen and nitrogen trifluoride ($NF_3$).

Alternatively, the free bonding site may be formed using ion implantation at a low energy to form the free bonding site. The ion implantation is implemented by using an inert gas at an energy of about 1 to 5 KeV and a dose of about $0.5 \times 10^{15}$ to $1.5 \times 10^{15}/cm^2$. The ion implanting angle during the ion implantation is in a range of about 13 to 17°.

After forming the free bonding site, the surface may also be treated with an ammonia plasma.

Methods according to the present invention for manufacturing a semiconductor device may also comprise the following steps. First, a silicon nitride layer is formed on a semiconductor substrate on which a predetermined pattern is formed. Next, a hydrophilic property or hydrophilicity is provided onto a surface of the silicon nitride layer. After that, a silicon oxide layer is formed using a silane compound and a flow fill method. In order to provide the hydrophilicity, the surface of the silicon nitride layer is preferably treated with an ammonia plasma.

In accordance with the present invention, a method of manufacturing a semiconductor device may also comprise the following steps.

First, a gate pattern is formed on a semiconductor substrate. Then, a spacer is formed on a sidewall portion of the gate pattern and a silicon nitride layer is formed. Thereafter, a free bonding site is formed on a surface of the silicon nitride layer by breaking a portion of bonds between silicon and nitrogen. A silicon oxide layer is formed using a silane compound and a flow fill method. After forming the free bonding site, the surface is preferably treated with an ammonia plasma.

According to the present invention, a free bonding site is formed on the surface of a silicon nitride layer. Because the silicon nitride layer is formed on the whole or entire surface of an underlying layer, the shape and the flection of the silicon nitride layer is the same as that of the pattern of the underlying layer. Therefore, when the pattern of the underlying layer has a small gap size, the nitride layer to be formed on the layer also will be formed so as to have a small gap size. An oxide layer is formed on the surface of the silicon nitride layer. Owing to the free bonding site, separation of the silicon nitride layer and the oxide layer at an interface therebetween during annealing can be prevented. Further, the hydrophilicity of the surface portion of the silicon nitride layer is increased and a flowing characteristic of the subsequently deposited oxide layer is improved to enhance the interface between the nitride layer and the oxide layer.

The method of the present invention can be advantageously applied when the gap formed between the patterns of the nitride layer is very small, and preferably when the gap size is about 50 nm or less, and more preferably when the gap size is in a range of about 40 to 50 nm. In addition, the method of the present invention is preferably applied when an aspect ratio of the gap is high. When the method of the present invention is applied with a gap having a small size and a high aspect ratio, a remarkable effect can be obtained. The method of the present invention is advantageously applied when the aspect ratio of the gap formed between the patterns of the nitride layer is in a range of about 1:8 to 1:14.

The silicon oxide layer formed on the silicon nitride layer is preferably formed through a condensation reaction of a hydroxy silane compound having a formula of $R_{4-n}Si(OH)_n$, wherein R represents an alkyl group and n denotes 1, 2, 3 or 4, especially $CH_3Si(OH)_3$ and $Si(OH)_n$, which is produced through a reaction of a silane compound and hydrogen peroxide gas. The hydroxy silane compound is widely used for filling patterns having a small gap size when using the flow fill method.

Because the silicon nitride layer includes SiN bonds and no site which can make a new bond remains on the surface of the layer, the silicon nitride layer is not reacted with the hydroxy silane compound produced from the reaction of the subsequently applied silane compound and peroxide. However, when the surface of the silicon nitride layer is etched to about 10 to 20 Å by means of a remote plasma or when an ion implantation is applied to the silicon nitride layer in accordance with preferred embodiments of the present invention, a new site is produced that can form a new bond with the subsequently applied material. This site is called a free bonding site or dangling bond. The free bonding site assists the subsequently applied material in forming a strong bond with the SiN layer. This bond is sufficiently strong to prevent the layers at the interface from separating when subjected to a subsequently implemented heat treatment.

In order to etch the SiN layer by means of the remote plasma, a mixed gas of carbon tetrafluoride ($CF_4$), oxygen, nitrogen and hydrogen fluoride can be used. Preferably, the mixed gas plasma is generated at a power of about 400 W or less and a pressure of about 90 Pa or less at ambient temperature. The preferred reaction gas is obtained by mixing each component in a mixing ratio of about 10 sccm or less of carbon tetrafluoride, 150 sccm or more of oxygen, 150 sccm or more of nitrogen, and 140 sccm or less of hydrogen fluoride. When the thus generated plasma is introduced into a chamber in which a target is installed, the reaction mainly proceeds as radical reactions.

Alternatively, a remote plasma using a mixed gas of hydrogen, nitrogen and nitrogen trifluoride ($NF_3$) can be used. Preferably, the mixed gas plasma is generated at a power of about 400 to 1200 W and a pressure of about 1 Torr or more at a temperature of about 25° C. or less. The preferred reaction gas is obtained by mixing each component in a mixing ratio of about 10 to 30 sccm of hydrogen, 200 sccm or less of nitrogen, and 200 sccm or less of nitrogen trifluoride. When the thus generated plasma is introduced into a chamber in which a target is installed, the reaction is considered to mainly proceed by excited species.

The conventionally applied plasma is anisotropic because the generated plasma directly impacts the layer of a target. However, the remote plasma applied in the present invention is isotropic because the generated plasma in a separate chamber is injected into a reaction chamber in which the target is installed. Accordingly, the sidewall portion of the gap of the etching layer can be sufficiently treated to thereby prevent the generation of a defect at the interface, especially at the sidewall portion of the gap.

According to other embodiments of the present invention, a dangling bond or free bonding site can be formed on the surface of the SiN layer by means of an ion implantation process at a low energy. According to this method, the ions are implanted into the surface portion of the etching layer to thereby physically break the SiN bonds at the surface portion of the etching layer.

The ion implantation is preferably implemented using an inert gas and at an energy in the range of about 1 to 5 KeV and a dose of about $0.5 \times 10^{15}$ to $1.5 \times 10^{15}$/cm. The preferred injecting angle of the ion implantation is in a range of about 13 to 17°.

More preferably and in accordance with the present invention, a method for increasing the hydrophilicity at the surface portion of the SiN layer can be used. When the hydrophilicity of the surface portion of the SiN layer is increased, the polar hydroxy silane compound which includes a number of hydroxy functional groups can be strongly attached to the surface portion of the SiN layer because the hydroxy silane compound deposited on the SiN layer is a hydrophilic compound. The treatment to increase the hydrophilicity may proceed independently after forming the SiN layer. Alternatively, this treatment can be additionally carried out after implementing the etching treatment using the remote plasma or the ion implantation at low energy. The effect is further improved when two treatments are performed one by one as compared to the effect obtainable from performing only one of the above-described treatments.

Hereinafter, embodiments of the present invention will be described in more detail with reference to the attached drawings.

According to embodiments of the present invention, a method of forming a contact hole of a semiconductor device by means of a self-aligned method will be described with reference to FIGS. 4A to 4D.

Figure 4A:
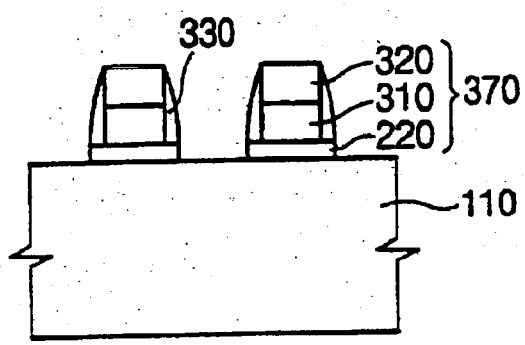
FIGS. 4A to 4D are cross-sectional views illustrating a method of forming a contact hole of a semiconductor device in accordance with embodiments of the present invention.

Referring to FIG. 4A, a gate oxide layer 220 is formed on a semiconductor substrate 110, such as a silicon substrate. Then, a conductive layer and a capping insulation layer are subsequently formed on the gate oxide layer. The conductive layer is a doped polysilicon layer or a polycide layer. The polycide layer may include a doped polysilicon layer and a refractive metal silicide layer. The refractive metal silicide layer is comprised of tungsten silicide, titanium silicide, cobalt silicide, etc. The capping insulation layer is preferably a silicon nitride layer that exhibits a high etching selectivity with respect to the oxide layer.

Next, the capping insulation layer and the conductive layer are continuously patterned to form parallel gate patterns 370 on a predetermined region of the gate oxide layer.

The width of the gate patterns 370 is about 2000 Å and the thickness of the gate patterns 370 is about 4500 Å. Each of the gate patterns 370 includes the subsequently integrated structures of a conductive layer pattern 310 and a capping insulation layer pattern 320. The conductive layer pattern 310 functions as a gate electrode.

A silicon nitride layer is formed on the entire surface of the product formed above (including the gate patterns 370). Then, the silicon nitride layer is anisotropically etched to form a spacer 330 preferably having a thickness of about 500 Å at the sidewall portion of the gate pattern 370. At this time, the gate oxide layer formed between the gate patterns 370 may be over-etched to expose the semiconductor substrate 110 or such that a thinner oxide layer than the initial oxide layer remains. After completing the formation of the spacer 330, the conductive pattern 310, that is, the gate pattern, is surrounded by the gate oxide layer pattern 220, the capping insulation layer pattern 320 and the spacer 330 as shown in FIG. 4A.

When implementing the anisotropic etching to form the spacer 330, etching damage is formed on the surface of the semiconductor substrate. To cure the etching damage, the thus obtained product (including the spacer 330) is thermally oxidized at a predetermined temperature. A thin thermal oxide layer is formed on the surface of the semiconductor substrate 110 between the gate patterns 370. Ion implantation is implemented using the thin thermal oxide layer as a screen oxide layer to form a source/drain region (not shown) in the semiconductor substrate 110 between the gate patterns 370.

Figure 4B:
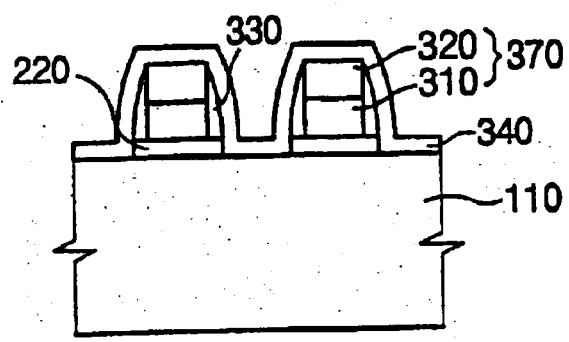

Referring to FIG. 4B, an etching stop layer 340 is formed on the entire surface of the substrate including the spacer 330. For example, a silicon nitride layer may be formed by a CVD method. The etching stop layer 340 is preferably formed to have a thickness of about 70 to 150 Å, and, more preferably, of about 100 Å.

Figure 4C:
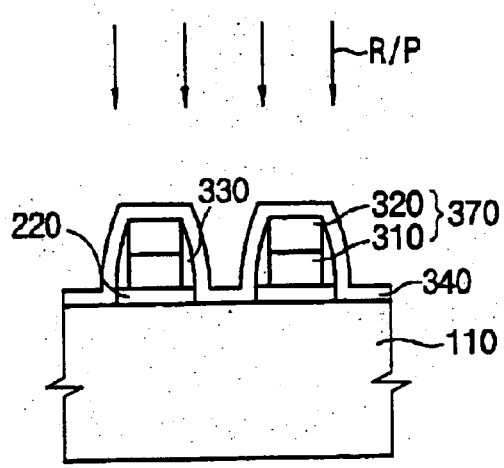

Referring to FIG. 4C, a remote plasma (R/P) is applied to the thus formed SiN layer 340. Through the remote plasma treatment, the surface of the silicon nitride layer is isotropically etched to about 10 to 20 Å to form free bonding sites or dangling bonds at the surface portion of the SiN layer. A remote plasma using a mixed gas including carbon tetrafluoride, oxygen, nitrogen and hydrogen fluoride can be used for the etching treatment. The plasma is preferably generated as follows. Power of about 400 W is applied for about 15 seconds under a pressure of about 75 Pa at a temperature of about 25° C. The flowing ratio of the mixed gas of $CF_4/O_2/N_2/HF$ is preferably equal to about 8/162/150/140 sccm. This etching method is hereinafter referred to as CDE (chemical dry etching).

Figure 4D:
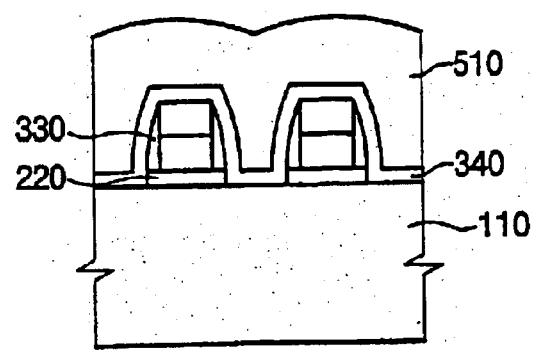

Referring to FIG. 4D, an interlayer dielectric 510 is formed on the etching stop layer 340 using an interlayer dielectric material having a good gap filling characteristic by means of a flow fill method. The gaseous phases of $SiH_4$ and hydrogen peroxide ($H_2O_2$) are reacted with each other to give $Si(OH)_4$. This product reacts on the surface of the SiN layer 340 in a liquid phase. That is, this product is dehydrated to form a polymer and is deposited as an $SiO_2$ layer. When the surface of the SiN layer is CDE treated, the free bonding sites or dangling bonds that are formed by breaking chemical bonds and are free reacting sites, are present on the surface of the SiN layer 340. Therefore, when an oxide material is subsequently deposited to form an oxide layer using the flow fill method after the CDE treatment, the thus formed free bonding sites and the oxide materials favorably react to increase the adhesion between the SiN layer 340 and the oxide layer 510, thereby improving bonding strength at the interface therebetween.

Next, a heat treatment at a temperature in the range of about 700 to 800° C. is used to dehydrate and form the interlayer dielectric 510 from the oxide layer. The interlayer dielectric 510 is planarized by means of a known method such as a CMP (chemical mechanical polishing) method.

Thereafter, a photoresist pattern having a predetermined shape is formed for patterning the planarized interlayer dielectric. Then, the interlayer dielectric is etched using the thus formed photoresist pattern to expose the etching stop layer between the gate patterns. The exposed etching stop layer is etched according to known processes to expose the semiconductor substrate between the gate patterns to form a self-aligned contact hole.

According to the second embodiment of the present invention, the same procedure described in the first embodiment is applied, except that a remote plasma using a mixed gas of hydrogen, nitrogen and nitrogen trifluoride is used. The same procedure illustrated in FIGS. 4A to 4D can be used. However, referring to FIG. 4C, the surface of the SiN layer 340 is treated using a mixed gas of hydrogen/nitrogen/nitrogen trifluoride, preferably in a mixing ratio of 10/1800/90 sccm, instead of the mixed gas system of carbon tetrafluoride/oxygen/nitrogen/hydrogen fluoride. Preferably, a power of about 400 W is applied at a pressure of about 4 Torr for about 90 seconds at a temperature of about 15° C. This type of etching method is hereinafter referred to as NOR (native oxide remove).

With reference to FIG. 4D, an interlayer dielectric is formed on the etching stop layer using an interlayer dielectric material having a good gap filling characteristic and by means of a flow fill method. In accordance with this embodiment, when the surface of the SiN layer 340 is NOR-treated, free bonding sites or dangling bonds which do not make any bonds are formed on the SiN layer 340. Therefore, when an oxide material is subsequently deposited to form the oxide layer 510 using the flow fill method after the NOR treatment, the thus formed free bonding sites and the oxide materials are favorably reacted with each other to increase the adhesion between the SiN layer 340 and the oxide layer 510, thereby improving the bonding strength at the interface therebetween.

Next, a heat treatment, preferably at a temperature in the range of about 700 to 800° C., is implemented, preferably for about 30 minutes, to dehydrate and form the interlayer dielectric from the oxide layer.

In order to observe the change at the surface of the SiN layer caused by the remote plasma treatment of the SiN layer, an XPS analysis was implemented. The SiN layer formed by the conventional method also was analyzed for comparison. FIGS. 5A to 5D are graphs obtained by XPS analyses on the surfaces of the SiN layers.

Figure 5A:
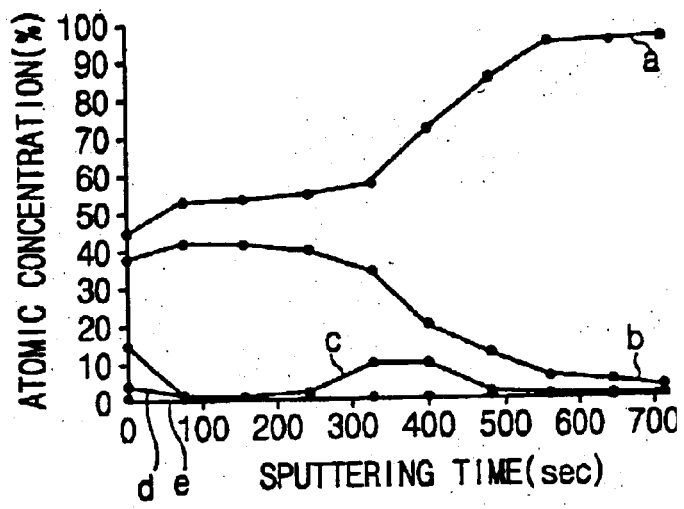
Figure 5B:
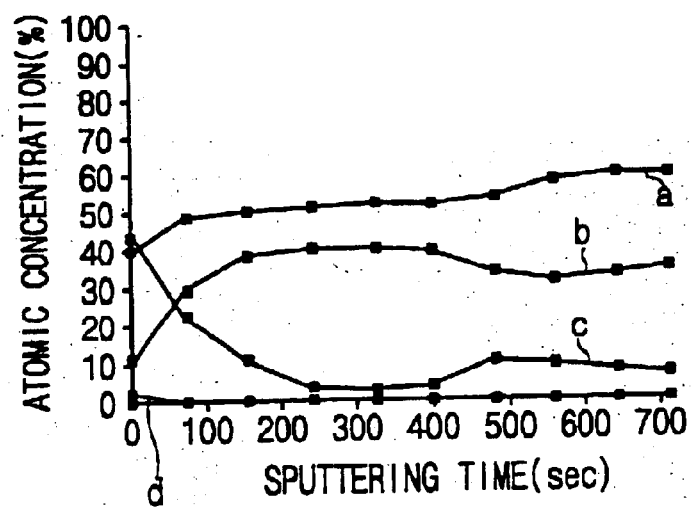
Figure 5C:
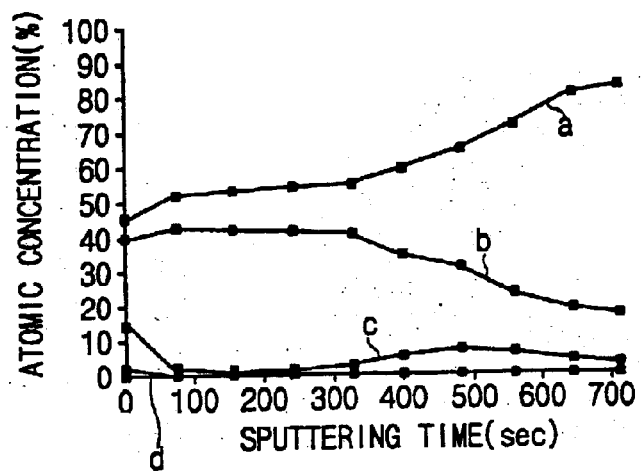
Figure 5D:
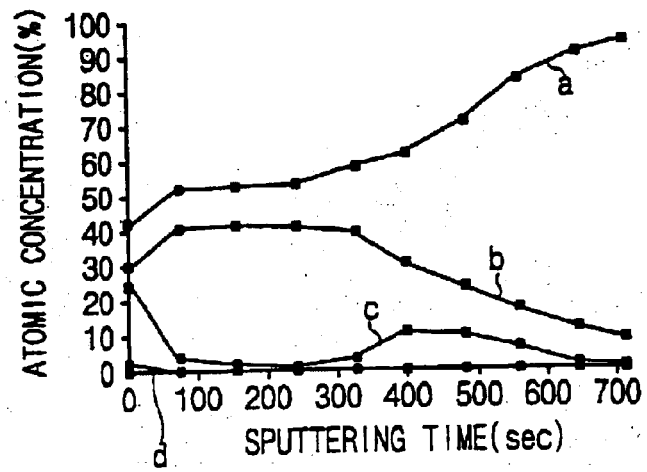

FIG. 5A corresponds to the result obtained by analyzing the surface of the SiN layer onto which no treatment was implemented. FIG. 5B corresponds to the result obtained by analyzing the surface of the SiN layer after implementing an $N_2O$ plasma. FIG. 5C corresponds to the result obtained by analyzing the surface of the SiN layer after implementing a CDE treatment according to the first embodiment of the present invention. FIG. 5D corresponds to the result obtained by analyzing the surface of the SiN layer after implementing an NOR treatment according to the second embodiment of the present invention.

Referring to FIG. 5A, the results illustrated therein were obtained by analyzing the surface of the SiN layer onto which no treatment was implemented, wherein curve a represents the atomic concentration of silicon and curve b represents the atomic concentration of nitrogen, and curves c, d and e represent the atomic concentrations of oxygen, carbon and fluorine, respectively.

Referring to FIG. 5B, the results illustrated therein were obtained by analyzing the surface of the SiN layer after implementing an $N_2O$ plasma treatment. In comparison with the results of FIG. 5A, the atomic concentration of oxygen (refer to curve c) at the surface portion is largely increased while the atomic concentration of silicon (curve a), nitrogen (curve b), carbon (curve d), etc. were not much changed. These results are interpreted as showing that oxide bonds are formed at the surface portion by the $N_2O$ plasma treatment. According to the conventional $N_2O$ plasma treatment, oxide bonds are formed at the surface portion of the layer to increase the affinity to subsequently applied material to form a subsequent layer and to improve an interface characteristic.

Referring to FIGS. 5C and 5D, the results illustrated therein were obtained by analyzing the surface of the SiN layer after implementing a CDE treatment according to the first embodiment of the present invention (FIG. 5C) and after implementing an NOR treatment according to the second embodiment of the present invention (FIG. 5D). In contrast to the result illustrated in FIG. 5B, the atomic concentration of oxygen (refer to curve c) is slightly increased and the atomic concentrations of silicon, nitrogen, carbon, etc., exhibit similar shapes as illustrated in FIG. 5A. From this result, it is noted that no oxide bond is formed on the SiN layer by the remote plasma treatment according to the first and second embodiments of the present invention.

Figure 6:
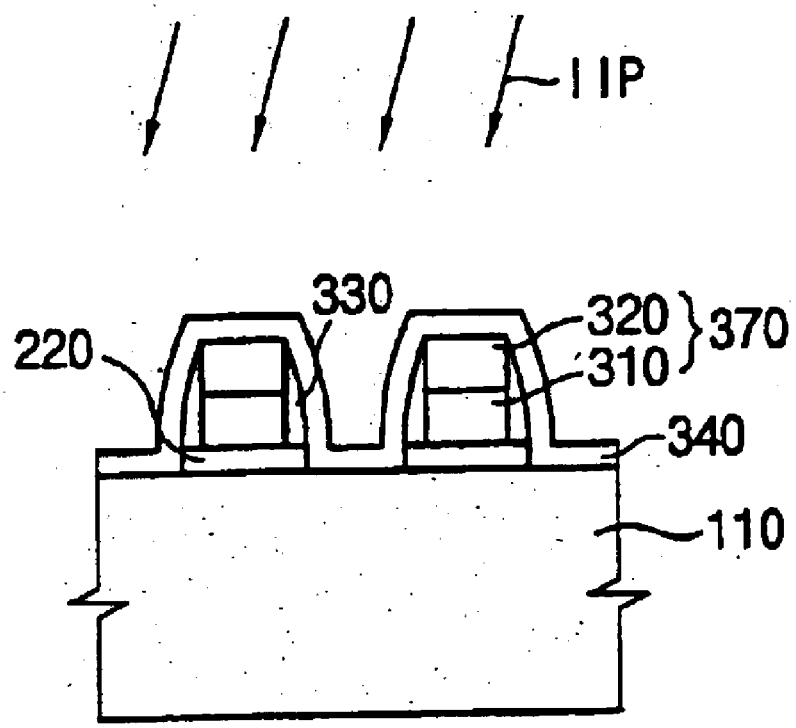
FIG. 6 is a cross-sectional view illustrating a method of forming a contact hole of a semiconductor device in accordance with further embodiments of the present invention.

In accordance with the present invention, an ion implantation may be applied into the surface portion of the SiN layer to form free bonding sites or dangling bonds at the surface portion of the SiN layer. FIG. 6 is a cross-sectional view illustrating a method of forming a contact hole of a semiconductor device in accordance with further embodiments of the present invention.

First, an SiN layer 340 is formed on a gate pattern 370 in accordance with the procedure illustrated in FIGS. 4A and 4B and described above with reference thereto. Then, an ion implantation (IIP) is implemented with a low energy in order to form free bonding sites at the surface portion of the SiN layer 340. Through the ion implantation, chemical bonds are physically broken to form reactive sites that are available to form bonds. Preferably, the ion implantation is carried out using an inert gas with an energy of 1 to 5 KeV with a dose of $0.5 \times 10^{15}$ to $1.5 \times 10^{15}/cm^2$. The preferred injecting angle of the ion implantation is in the range of about 13 to 17°. Preferably, Flourine (F) with an energy of 1 KeV and a dose of $1 \times 10^{15}/cm^2$ or Argon (Ar) with an energy of 5 KeV and a dose of $1 \times 10^{15}/cm^2$ is applied with an ion injecting angle of about 15° to form free bonding sites at the surface portion of the SiN layer 340 (Embodiments 3 and 4).

Thereafter, an interlayer dielectric 510 is formed on the SiN etching stop layer 340 using an interlayer dielectric material which has a good gap filling characteristic using the flow fill method and repeating the method described in the first embodiment. Gaseous phase $SiH_4$ and hydrogen peroxide ($H_2O_2$) are reacted with each other to produce $Si(OH)_4$. This product reacts on the surface of the SiN layer 340 in a liquid phase. That is, this product is dehydrated to form a polymer and is deposited as an $SiO_2$ layer. When the ion implantation treatment is implemented into the surface of the SiN layer 340 at a low energy according to this embodiment, free bonding sites are provided on the surface of the SiN layer 340. Therefore, when an oxide material is subsequently deposited to form the oxide layer 510 using the flow fill method after the ion implantation, the thus formed free bonding sites and the oxide materials are favorably reacted with each other to increase the adherence between the SiN layer 340 and the oxide layer 510, thereby improving bonding strength at the interface therebetween.

Next, a heat treatment, preferably at a temperature in the range of about 700 to 800° C., is implemented, preferably for about 30 minutes, to dehydrate and form the interlayer dielectric 510 formed of an oxide layer.

According to the fifth embodiment of the present invention, a method of providing hydrophilicity onto the surface of the SiN layer can be used.

After forming the SiN layer, the surface is treated with ammonia ($NH_3$) plasma. A thin nitride layer is grown on the surface of the SiN layer by the ammonia plasma treatment. Free bonding sites or dangling bonds are not formed on the surface portion of the SiN layer. That is, hydrophilic bonds such as N—H bonds are formed on the surface of the SiN layer to enhance affinity with subsequently applied material that includes hydroxy functional groups.

To confirm the increase in the hydrophilicity after completing the ammonia plasma treatment, a drop of water was allowed to fall on various layers including the SiN layer. The contact angle between the surface of the layer and the drop of water was measured and is illustrated in Table 1. When the hydrophilicity of the layer is high, the drop of water will spread out widely and the contact angle will be small.

TABLE 1

| Surface treatment condition | Contact angle (°) |
|---|---|
| SiN | 37.7 |
| SiN/$N_2O$ plasma 20 sec | 24.4 |
| SiN/$N_2O$ plasma 20 sec/F IIP | 16.8 |
| SiN/$N_2O$ plasma 100 sec | 17.8 |
| SiN/$O_2$ plasma 2 min | 11.6 |
| SiN/Ar IIP | 34.3 |
| SiN/F IIP | 32.3 |
| SiN/NOR | 28.4 |
| SiN/CDE | 34.4 |
| SiN/$H_2$ plasma | 20.9 |
| SiN/700° C. annealing/$H_2$ plasma 25 sec | 18.8 |
| SiN/$NH_3$ plasma 2 min | <3 |

Referring to Table 1, the SiN layer onto which no treatment was implemented had the lowest hydrophilicity. Further, the hydrophilicity of the SiN layer was increased little by the CDE treatment, the NOR treatment, or the ion implantation process. In contrast, the hydrophilicity of the SiN layer was somewhat increased by the $N_2O$ plasma treatment. However, the hydrophilicity was remarkably increased by the ammonia plasma treatment in accordance with this embodiment of the present invention.

Figure 7A:
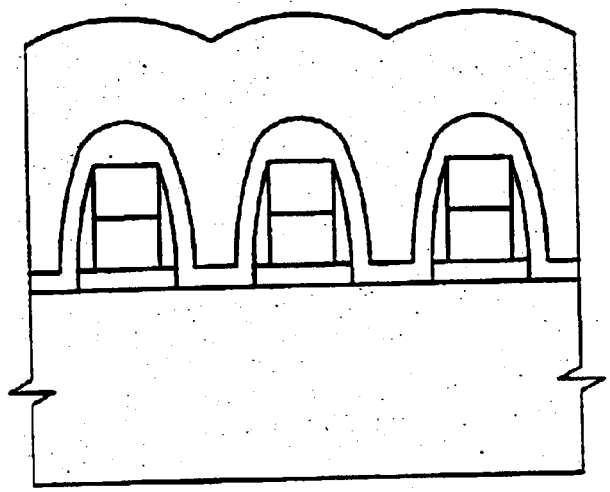
FIGS. 7A to 7E are cross-sectional views taken after forming an oxide layer on an SiN layer by the flow fill method and then implementing a heat treatment according to the present invention for comparing adhesion characteristics at the interface, wherein the construction of FIG. 7A is obtained when a CDE treatment is applied to the surface of the SiN layer according to the first embodiment of the present invention, the construction of FIG. 7B is obtained when an NOR treatment is applied to the surface of the SiN layer according to the second embodiment of the present invention, the construction of FIG. 7C is obtained when fluorine ions are injected onto the surface of the SiN layer according to a third embodiment of the present invention, the construction of FIG. 7D is obtained when argon ions are injected into the surface of the SiN layer according to a fourth embodiment of the present invention, and the construction of FIG. 7E is obtained when an ammonia plasma treatment is applied to the surface of the SiN layer according to a fifth embodiment of the present invention.
Figure 7B:
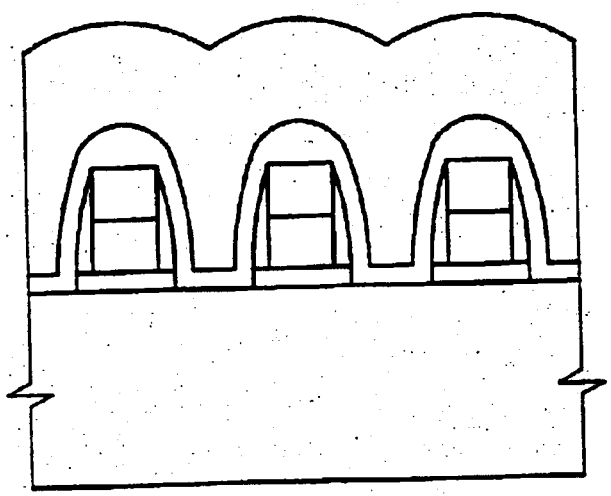
Figure 7C:
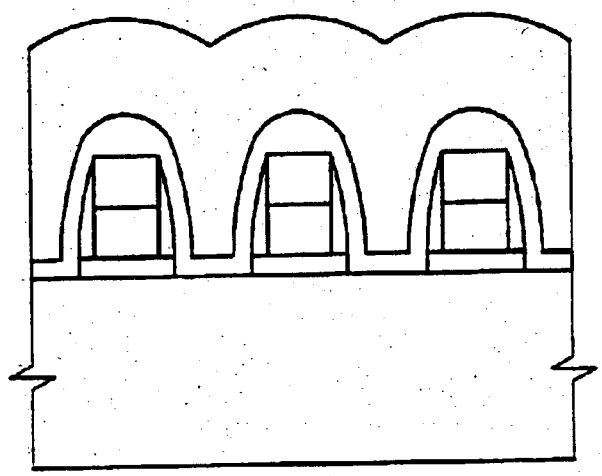
Figure 7D:
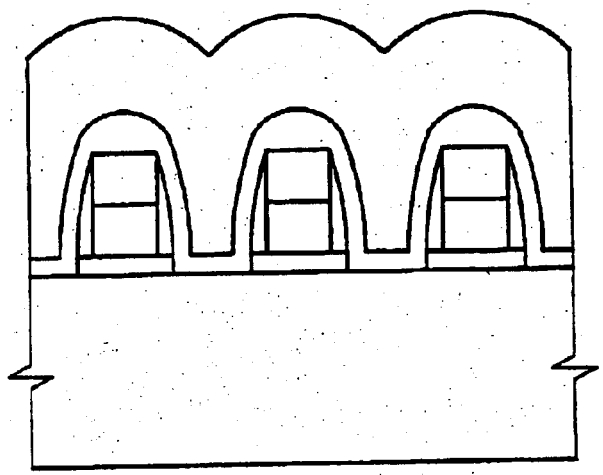
Figure 7E:
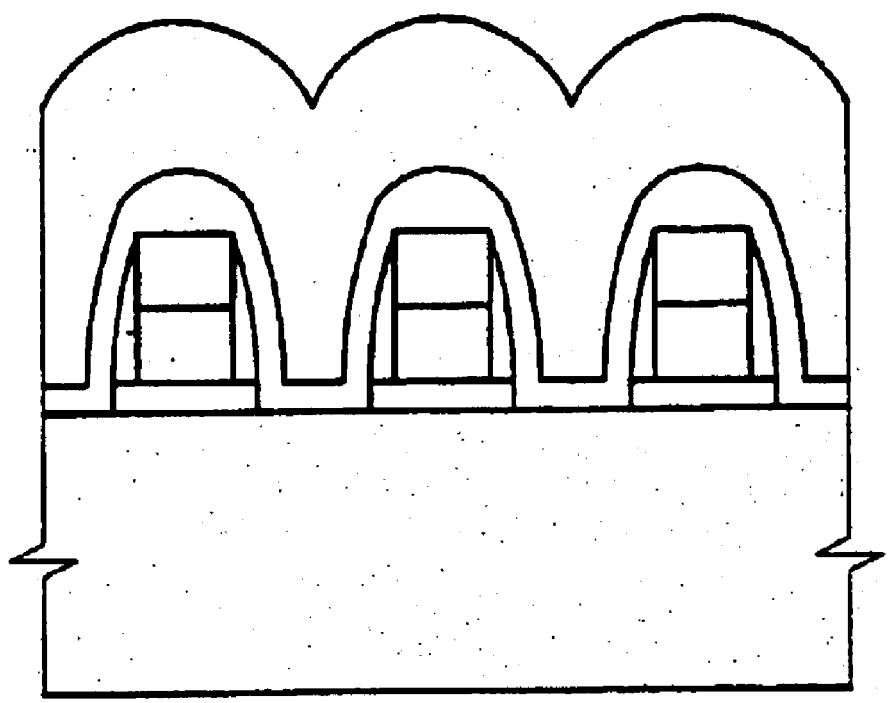

FIGS. 7A to 7E are cross-sectional views after forming an oxide layer on an SiN layer by the flow fill method and then implementing a heat treatment in accordance with the present invention for comparing adhesion characteristics at the interface between the SiN and oxide layers. FIG. 7A is a sectional view obtained when a CDE treatment is applied to the surface of the SiN layer in accordance with the first embodiment of the present invention. FIG. 7B is a sectional view obtained when an NOR treatment is applied to the surface of the SiN layer in accordance with the second embodiment of the present invention. FIG. 7C is a sectional view obtained when fluorine ions are injected onto the surface of the SiN layer in accordance with the third embodiment of the present invention. FIG. 7D is a sectional view obtained when argon ions are injected onto the surface of the SiN layer in accordance with the fourth embodiment of the present invention. FIG. 7E is a sectional view obtained when an ammonia plasma treatment is applied to the surface of the SiN layer in accordance with the fifth embodiment of the present invention.

As illustrated by the drawings, the interface characteristic between the SiN layer and the subsequently formed oxide layer is improved and the phenomena of coming-off or separation of the two layers can be prevented by using the methods of the present invention.

As described above, when an oxide layer is formed on a silicon nitride layer by means of a flow fill method and in accordance with the methods of the present invention, the interface characteristic and adhesion between the nitride layer and the oxide layer are improved. Therefore, semiconductor devices having improved quality can be manufactured.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. A method of manufacturing a semiconductor device, the method comprising:

forming a silicon nitride layer on a semiconductor substrate on which a predetermined pattern is formed, the silicon nitride layer including a plurality of bonds formed between silicon and nitrogen;

breaking a portion of the bonds formed between silicon and nitrogen to form at least one free bonding site on a surface of the silicon nitride layer; and using a silane compound and a flow fill method to form a silicon oxide layer on the silicon nitride layer.

2. The method of claim 1 wherein the step of breaking a portion of the bonds includes isotropically etching a surface portion of the silicon nitride layer to a depth of between about 10 and 20 Å using a remote plasma.

3. The method of claim 2 including producing the remote plasma using a mixed gas including carbon tetrafluoride ($CF_4$), oxygen, nitrogen and hydrogen fluoride.

4. The method of claim 2 including producing the remote plasma using a mixed gas including hydrogen, nitrogen and nitrogen trifluoride ($NF_3$).

5. The method of claim 1 wherein the step of breaking a portion of the bonds includes using ion implantation.

6. The method of claim 5 including using an inert gas at an energy of about 1 to 5 KeV and a dose of about $0.5 \times 10^{15}$ to $1.5 \times 10^{15}/cm^2$ to implement the ion implantation.

7. The method of claim 5 including using an ion implanting angle of about 13 to 17° during the ion implantation.

8. The method of claim 1 further comprising treating the surface of the silicon nitride layer with an ammonia plasma after forming the free bonding site.

9. The method of claim 1 wherein the step of forming the silicon oxide layer includes using a condensation reaction of a hydroxy silane compound having a formula of $R_{4-n}Si(OH)_n$, wherein R represents an alkyl group and n is 1, 2, 3, or 4, obtained by a reaction of a silane compound and a hydrogen peroxide gas.

10. The method of claim 1 wherein the step of forming the silicon nitride layer includes forming the silicon nitride layer so as to have a shape corresponding to that of an underlying pattern, and to define a gap between neighboring patterns, the gap having a gap size of between about 40 and 50 nm.

11. The method of claim 10 wherein an aspect ratio of the gap formed between the neighboring patterns of the silicon nitride layer is in the range of about 1:8 to 1:14.

12. The method of claim 1 wherein the step of forming the silicon nitride layer includes forming the silicon nitride layer on an entire surface of an underlying layer and the underlying layer is not exposed through the silicon nitride layer.

13. A method of manufacturing a semiconductor device, the method comprising:

forming a silicon nitride layer on a semiconductor substrate on which a predetermined pattern is formed;

increasing the hydrophilicity of a surface of the silicon nitride layer; and using a silane compound and a flow fill method to form a silicon oxide layer on the silicon nitride layer.

14. The method of claim 13 including treating the surface of the silicon nitride layer with an ammonia plasma.

15. The method of claim 13 wherein the step of forming the silicon nitride layer includes forming the silicon nitride layer so as to have a shape corresponding to that of an underlying pattern, and to define a gap between neighboring patterns, the gap having a gap size of between about 40 and 50 nm.

16. The method of claim 15 wherein an aspect ratio of the gap formed between the neighboring patterns of the silicon nitride layer is in the range of about 1:8 to 1:14.

17. A method of manufacturing a semiconductor device, the method comprising:

forming a gate pattern on a semiconductor substrate;

forming a spacer on a side wall portion of the gate pattern;

forming a silicon nitride layer, the silicon nitride layer including a plurality of bonds formed between silicon and nitrogen;

breaking a portion of the bonds between silicon and nitrogen to form free bonding sites on a surface of the silicon nitride layer; and using a silane compound and a flow fill method to form a silicon oxide layer on the silicon nitride layer.

18. The method of claim 17 wherein the step of forming the silicon nitride layer includes forming the silicon nitride layer so as to have a shape corresponding to that of an underlying pattern, and a gap between neighboring patterns, the gap having a gap size of between about 40 and 50 nm.

19. The method of claim 17 wherein an aspect ratio of the gap formed between the neighboring patterns of the silicon nitride layer is in the range of about 1:8 to 1:14.

* * * * *

UNITED STATES PATENT AND TRADEMARK OFFICE
CERTIFICATE OF CORRECTION

PATENT NO. : 6,774,048 B2  Page 1 of 1
DATED : August 10, 2004
INVENTOR(S) : Baek et al.

It is certified that error appears in the above-identified patent and that said Letters Patent is hereby corrected as shown below:

<u>Column 14,</u>
Line 63, please add the following claims:
20. The method of Claim 17 wherein the step of breaking a portion of the bonds includes isotropically etching a surface portion of the silicon nitride layer to a depth of between about 10 and 20Å using a remote plasma.

21. The method of Claim 17 wherein the step of breaking a portion of the bonds includes using ion implantation.

22. The method of Claim 17 further comprising treating the surface of the silicon nitride layer with an ammonia plasma after forming the free bonding site.

Signed and Sealed this

Fourth Day of January, 2005

JON W. DUDAS
*Director of the United States Patent and Trademark Office*